United States Patent [19]

Farooq et al.

[11] Patent Number: 5,705,857
[45] Date of Patent: *Jan. 6, 1998

[54] CAPPED COPPER ELECTRICAL INTERCONNECTS

[75] Inventors: Mukta Shaji Farooq; Suryanarayana Kaja, both of Hopewell Junction, N.Y.; Eric Daniel Perfecto, Poughkeepsie, N.Y.; George Eugene White, Hoffman Estates, Ill.

[73] Assignee: International Business Machines Corporation, Armonk, N.Y.

[*] Notice: The term of this patent shall not extend beyond the expiration date of Pat. No. 5,545,927.

[21] Appl. No.: 618,023

[22] Filed: Mar. 25, 1996

Related U.S. Application Data

[63] Continuation of Ser. No. 440,414, May 12, 1995, Pat. No. 5,545,927.
[51] Int. Cl.[6] .................................... H01L 23/48
[52] U.S. Cl. .............................. 257/762; 257/766
[58] Field of Search ......................... 257/762, 765, 257/766, 758

[56] References Cited

U.S. PATENT DOCUMENTS

| | | | |
|---|---|---|---|
| 4,394,223 | 7/1983 | Hall | 204/15 |
| 4,810,332 | 3/1989 | Pan | 204/15 |
| 5,071,518 | 12/1991 | Pan | 205/122 |
| 5,132,775 | 7/1992 | Brighton et al. | 357/71 |
| 5,272,376 | 12/1993 | Veno | 257/762 |
| 5,298,687 | 3/1994 | Rapoport et al. | 174/261 |
| 5,326,412 | 7/1994 | Schreiber et al. | 156/150 |
| 5,382,447 | 1/1995 | Kaja et al. | 427/126.6 |
| 5,545,927 | 8/1996 | Farooq | 257/762 |

FOREIGN PATENT DOCUMENTS 5315332  11/1993  Japan .

OTHER PUBLICATIONS

"Alternative Ceramic Plate–Up Process", IBM Tech. Disc. Bulletin, vol. 32, No. 10A, Mar. 1990, p. 442.

Messner et al., *Thin Film Multichip Modules*, ISBN 0-930815-33-5, 1992 by International Society for Hybrid Microelectronics, Dec. 1992.

*Primary Examiner*—Mark V. Prenty
*Attorney, Agent, or Firm*—Aziz M. Ahsan

[57] ABSTRACT

The present invention relates generally to a new structure and method for capped copper electrical interconnects. More particularly, the invention encompasses a novel structure in which one or more of the copper electrical interconnects within a semiconductor substrate are capped to obtain a robust electrical interconnect structure. A method for obtaining such capped copper electrical interconnect structure is also disclosed. These capped interconnects can be a single layer or multi-layer structures. Similarly, the interconnect structure that is being capped can itself be composed of single or multi-layered material.

5 Claims, 2 Drawing Sheets

CAPPED COPPER ELECTRICAL INTERCONNECTS

CROSS-REFERENCE TO RELATED PATENT APPLICATION

This patent application Ser. No. 08/618,023, is a Continuation of U.S. patent application Ser. No. 08/440,414, which issued as U.S. Pat. No. 5,545,927, on Aug. 13, 1996. Furthermore, this Patent Application is related to U.S. patent application Ser. No. 08/440,413, which issued as U.S. Pat. No. 5,549,808, on Aug. 27, 1996, entitled "METHOD FOR FORMING CAPPED COPPER ELECTRICAL INTERCONNECTS", filed on May 12, 1995, assigned to the assignee of the instant Patent Application and the disclosure of which is incorporated herein by reference.

FIELD OF THE INVENTION

The present invention relates generally to a new structure and method for capped copper electrical interconnects. More particularly, the invention encompasses a novel structure in which one or more of the copper electrical interconnects within a semiconductor substrate are capped to obtain a robust electrical interconnect structure. A method for obtaining such capped copper electrical interconnect structure is also disclosed. These capped interconnects can be a single layer or multi-layer structures. Similarly, the interconnect structure that is being capped can itself be composed of single or multi-layered material.

BACKGROUND OF THE INVENTION

Semiconductor devices are becoming smaller and more dense with the evolution of new technology. However, increases in circuit density produce a corresponding increase in overall chip failure rates at a time when chip failure rates must decrease to remain competitive. Chip manufacturers are therefore challenged to improve the quality of their products by identifying and eliminating defects which produce defective chips known as fails. Whereas significant improvements are being made to eliminate systematic defects by reducing process variability. Process improvements alone are not sufficient to eliminate all the random defects which affect both yield and reliability. Historically, screening techniques have been employed to improve product failure rates to acceptable levels by culling out many of these random defects.

During a typical plating process, a resist stencil is created on an underlying seed layer, generally a metal. The part is then normally immersed in a plating solution. This immersion process creates plated features wherever the resist is absent. Typically, the electroplated metal is copper. After plating, the resist is stripped and the underlying seed layer is given a flash etch, i.e., a short, timed etch. One of the problems with this prior art flash etching process of the seed layer is that it is not easy to control. For example, one could get under-etching of the seed layer which can cause shorts, while over-etching not only removes the metal in the seed layer, but will also etch the plated features, thus creating loss of copper from conductor lines and in some cases, opens or near-opens.

U.S. Pat. No. 5,382,447 (Kaja, et al.), the disclosure of which is incorporated herein by reference and presently assigned to the assignee of the instant patent application, discloses an electroless capping after the etching of the seed layer. A conductive metal, e.g. copper, is coated with a capping layer of a metal, e.g. cobalt, which capping layer is further characterized as having a thin layer of capping metal oxide adhered to the surface thereof.

Another problem that has also been observed on product parts is the interaction of copper with polyimide, which is applied subsequently. It has been noticed that the copper can react with the polyamic acid and this has the potential to degrade the electrical performance of the package, as the copper migrates into the polyimide layer during cure. See for example, G. Messner, et al., THIN FILM MULTICHIP MODULES, p. 147 (1992).

U.S. Pat. No. 4,810,332 (Pan), discloses a method of making an electrical multilayer copper interconnect in which the electrical lines are protected by an electroplated overcoat. Preferably, before electroplating the overcoat, the copper is etched to expose the sides adjacent to the photoresist layer. This allows over-coating of all of the copper.

U.S. Pat. No. 5,071,518 (Pan), discloses a method of making an electrical multilayer interconnect in which the electrical lines are protected by an overcoat for corrosion resistance. This protective overcoat is deposited after the seed layer is removed by either electroless nickel or immersion coated tin.

Furthermore, for structures which employ subtractive etching of Cr/Cu/Cr to create wiring levels, the Cr capping layer does not cover the sidewalls, leaving the copper sidewall exposed during the copper etching step, and during subsequent processing. This exposure of the side wall in some cases leads to copper-polyimide interaction which can degrade the electrical performance of the structure.

PURPOSES AND SUMMARY OF THE INVENTION

The invention is a novel method and an apparatus for providing protection to electrical interconnects.

Therefore, one purpose of this invention is to provide an apparatus and a method that will provide a highly robust process.

Another purpose of this invention is to provide for improved thin film yields.

Still another purpose of this invention is to have a process that reduces costs.

Yet another purpose of this invention is to provide for a single or multi-level electrical interconnect.

Still yet another purpose of the invention is to provide a single or multi-level capping of an electrical interconnect.

Yet another purpose of the invention is to be able to provide an electrical connection between the internal wiring or vias in a substrate and the capped electrical interconnects.

Therefore, in one aspect this invention comprises a method of making capped electrical interconnect comprising the steps of:

(a) depositing at least one seed layer on a substrate, (b) depositing at least one resist layer over said at least one seed layer, (c) exposing and developing said at least one resist layer so as to define at least one opening in said at least one resist layer such that a portion of said at least one seed layer is exposed, (d) depositing copper in said at least one opening to define electrical interconnects, (e) thermally treating said substrate through at least one thermal cycle so that said resist separates from said deposited copper, and the side walls of said deposited copper are exposed, (f) capping said deposited copper electrical interconnect and the side walls thereof with at least one metallic capping material, (g) removing said at least one resist layer such that at least a portion of said at least one seed layer underneath said at least one resist layer is exposed, and (h) removing said exposed portion of said at least one seed layer, and thereby forming said capped electrical interconnect.

In another aspect this invention comprises a method of making capped electrical interconnect comprising the steps of:

(a) depositing at least one seed layer on a substrate, (b) depositing at least one resist layer over said at least one seed layer, (c) exposing and developing said at least one resist layer so as to define at least one opening in said at least one resist layer such that a portion of said at least one seed layer is exposed, (d) depositing copper in said at least one opening to define electrical interconnects, (e) developing said at least one resist layer using at least one heated developer solution so that said at least one resist separates from said deposited copper, and the side walls of said deposited copper are exposed, (f) capping said deposited copper electrical interconnect and the sidewalls thereof with at least one metallic capping material, (g) removing said at least one resist layer such that at least a portion of said at least one seed layer underneath said at least one resist layer is exposed, and (h) removing said exposed portion of said at least one seed layer, and thereby forming said capped electrical interconnect.

In yet another aspect this invention comprises a capped electrical interconnect structure comprising a substrate, having at least one seed layer, a copper material on a portion of said at least one seed layer and at least one capping material which completely envelopes said copper material, wherein a portion of said at least one capping material makes electrical contact with a portion of said seed layer and wherein the side walls of said seed layer do not have any capping material.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

Figure 1:
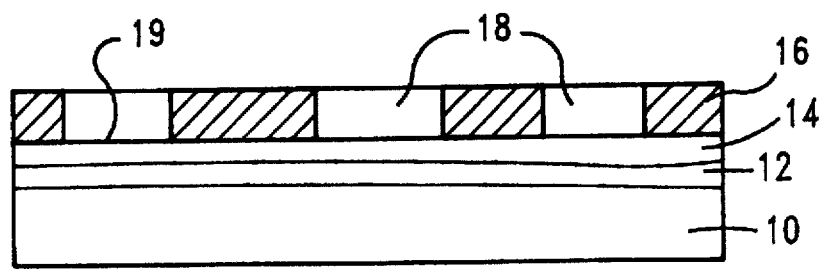
FIG. 1, illustrates one preferred starting embodiment of this invention.

FIG. 1, illustrates one preferred starting embodiment of this invention. On a standard substrate 10, such as, a ceramic or a glass-ceramic substrate, a first seed layer 12, preferably, chromium 12, is formed. Next a second seed layer 14, preferably, of copper 14, is formed over the first seed layer of chromium 12. It is preferred that the seed layers 12 and 14, are at least about 0.05 micron thick. By methods well known in the art, a resist stencil is formed over the upper surface 19, of the seed layer of copper 14, using a resist material 16. For best results, the resist material 16, should be conformally deposited. Typically, copper 18, is deposited, such as by electroplating, to obtain the structure as clearly shown in FIG. 1. The thickness of the deposited copper 18, should be between about 0.5 micron and about 100.0 micron, and preferably between about 2.0 microns and about 25.0 microns.

Figure 2:
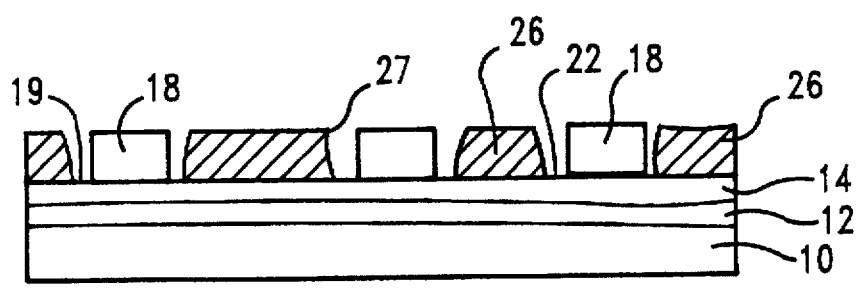
FIG. 2, illustrates the embodiment of FIG. 1, after the substrate has gone through at least one thermal cycle.

As shown in FIG. 2, the embodiment of FIG. 1, is then put through at least one thermal cycle. Basically, the resist 16, is at least once reflowed or baked or put through a thermal cycle. The temperature of the thermal cycle is preferably between about 50° C. and about 200° C., and more preferably about 105° C. It has been discovered that this heating cycle causes the resist 16, to pull back from the surrounding copper 18, features, leaving gaps or openings 22, in the sidewalls, and forming thermally cycled resist 26, as more clearly shown in FIG. 2. The amount and the time that a resist 16, would take to pull back to form the gaps or openings 22, depends upon the temperature and the type of the resist. It was also noticed that the thermally cycled resist 26, did not have straight side-walls, but the side-walls were at an angle or had a slope 27.

Figure 3:
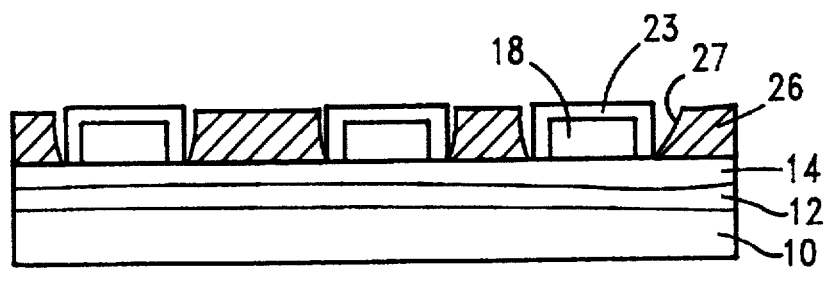
FIG. 3, illustrates an embodiment of this invention showing the capping of the copper electrical interconnects.

The next step is the capping of the copper electrical interconnect 18. FIG. 3, illustrates an embodiment of this invention showing the capping of the copper electrical interconnects. A capping material 23, is then deposited, such as by electroplating, over the copper electrical interconnect 18. This electroplating process not only forms a capping layer 23, on top of the copper interconnect 18, but, also on the side-walls of the copper interconnect 18.

Nickel capping material 23, is used to cover the copper 18, by, for example, electroplating or by electroless plating process.

Typical material that could be used as a capping layer 23, could be selected from a group comprising aluminum, chromium, cobalt, gold, nickel, palladium, platinum, silver, to name a few. The thickness of the capping layer 23, is between about 0.005 micron and about 10.000 microns, and preferably between about 0.010 micron and about 1.000 microns, and more preferably between about 0.100 micron and about 1.000 microns.

Figure 4:
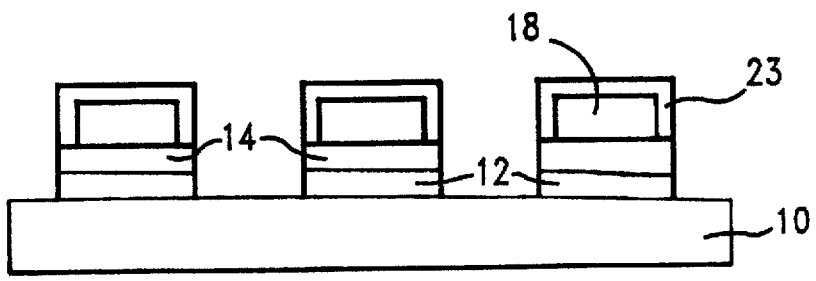
FIG. 4, illustrates the embodiments as shown in FIG. 3, after the photoresist and a portion of the seed layers have been removed.

FIG. 4, illustrates the embodiments as shown in FIG. 3, after the photoresist and a portion of the seed layer have been removed. Basically, the resist 26, is etched or stripped by methods well known in the art. Then the exposed layers of the seed material 12 and 14, are also removed, by methods well known in the art, such as, by etching, leaving the copper 18, with a layer of seed material 12 and 14, and capping layer 23.

During this seed etching process the copper 14, can now be removed with a greater amount of over-etch than previously allowed. This can be tolerated because there is no exposed copper in the features.

Figure 5:
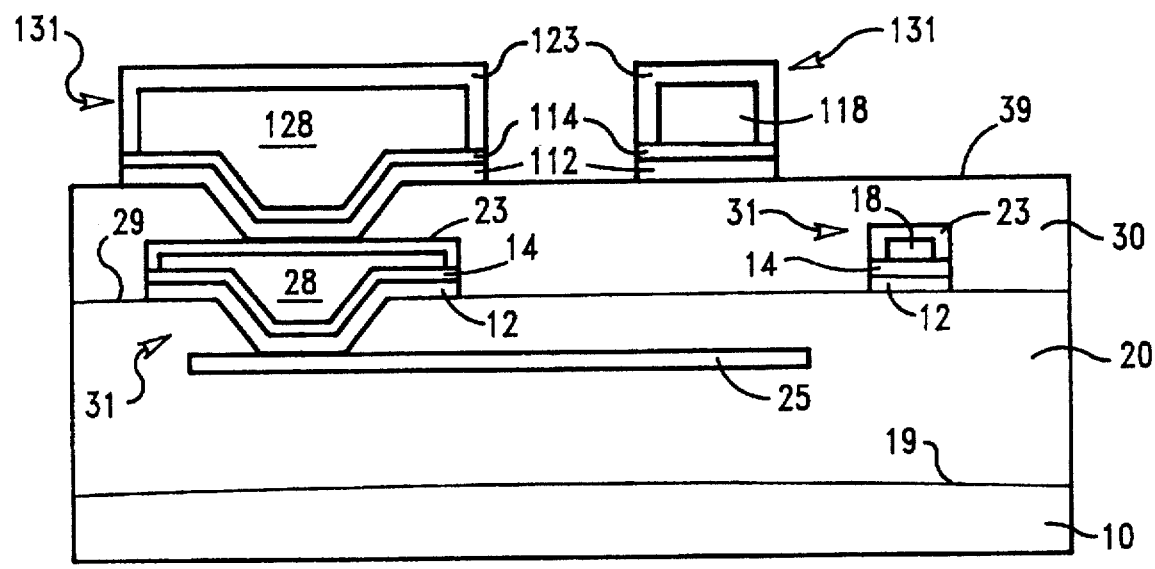
FIG. 5, illustrates another embodiment of the invention, showing a multi-level structure, which is made using the process of this invention.

FIG. 5, illustrates another embodiment of the invention, showing a multi-level structure, which is made using the process of this invention. The substrate 10, has a first insulation layer 20, and a second insulation layer 30. The first insulation layer 20, has at least one electrical interconnect feature 25, which typically is a copper wiring 25. Prior to the formation of the second insulation layer 30, one or more electrical interconnect 31, is formed using the process of this invention. This electrical interconnect 31, basically comprises a first seed layer 12, a second seed layer 14, a copper material 18 or 28, and a capping material 23. Depending upon the material of the insulator layer 20, one could dispense with one or more of the seed layers 12 and 14. The first seed layer 12, could be selected from a group comprising chromium, titanium, titanium-tungsten, or alloys thereof. While the second seed layer 14, could be selected from a group comprising aluminum, copper, or alloys thereof, to name a few.

The electrical interconnects and the upper surface 29, of the first insulator layer 20, are then covered with the second insulator layer 30. Using methods well known in the art, the upper surface 39, of the second insulator 30, is processed to form one or more electrical interconnect feature 131, using the process of this invention, as illustrated in FIG. 5. This electrical interconnect 131, basically comprises of a first seed layer 112, a second seed layer 114, a copper material 118 or 128, and a capping material 123. Depending upon the material of the insulator layer 30, one could dispense with one or more of the seed layers 112 and 114. The first seed layer 112, could be selected from a group comprising chromium, titanium, titanium-tungsten, etc. However, the second seed layer 114, could be selected from a group comprising aluminum, copper, etc., to name a few.

Figure 6:
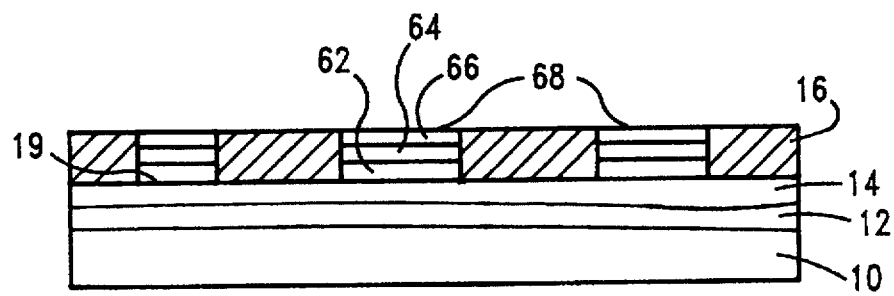
FIG. 6, illustrates another preferred starting embodiment of this invention.

FIG. 6, illustrates another preferred starting embodiment of this invention. On a standard substrate 10, such as, a ceramic or a glass-ceramic substrate, typically a seed layer of chromium 12, is formed. Next a seed layer of copper 14, is formed over the seed layer of chromium 12. By methods well known in the art, a resist stencil is formed over the seed layer of copper 14, using a resist material 16. Multiple layers of electrical interconnect 68, are then formed over the upper surface 19, of the seed layer 14. The interconnect layer 68, could comprise of layers 62, 64 and 66, illustrated here as an example. Of course one could have as many layers as the process or the structure would allow. It is preferred that the layers 62, 64 and 66, are formed by an electroplating process. It is obvious that the layers 62, 64, 66, etc., could comprise of the same material or different material. The material for the layers 62, 64 and 66, could be selected from a group comprising aluminum, copper, gold, nickel, to name a few.

Figure 7:
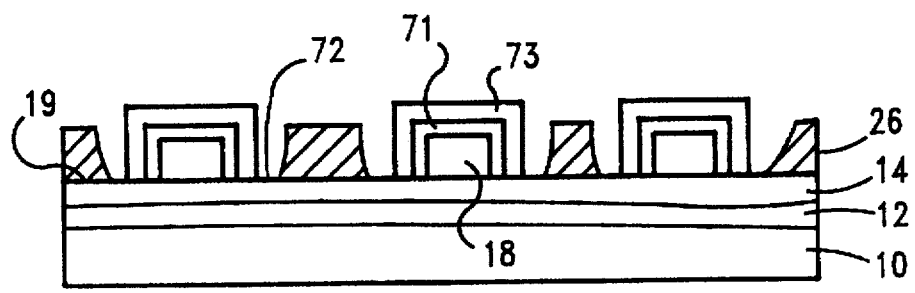
FIG. 7, illustrates yet another embodiment of this invention showing the capping of the copper electrical interconnects with multiple capping layers.

FIG. 7, illustrates yet another embodiment of this invention showing the capping of the copper electrical interconnects with multiple capping layers. On a structure formed after the thermal process, as illustrated in FIG. 2, a first capping layer or material 71, is electroplated over the copper electrical interconnect 18. This electroplating process not only forms a capping layer 71, on top of the copper interconnect 18, but, also on the side-walls of the copper interconnect 18. A second capping material or layer 73, can then be formed over the first capping layer 71. And, this capping process could continue as desired or until there is no more room in the gap or opening 72, to accommodate any additional capping material. It is obvious that the capping layers 71, 73, etc., could comprise of the same material or different material.

Typical material that could be used as a capping layers 71, 73, etc., could be selected from a group comprising of aluminum, cobalt, gold, nickel, silver, to name a few.

For applications or layers where no side wall protection is required, the process of heating the resist 16, so as to form a gap 22, can be omitted. This would allow for only the top surface of the copper 18, to be capped with the capping layer 23.

The nickel layer not only serves as a passivation layer but as an adhesion layer as well.

It has been found that by providing sidewall protection 23 or 73 or 123, to the copper interconnect 18 or 68 or 128, also has helped to eliminate the top passivation overcoat for corrosion protection, thus this eliminates another costly apply, expose and develop step.

The method of this invention not only reduces cycle time, but it also passivates the Cu prior to seed layer etching, thus eliminating any attack on the copper layer 18 or 68 or 128, during the etching of the seed layers 14, 114, and 12, 112.

It was also noticed that the plated copper surfaces that were protected by the capping layer 23 or 73 or 123, during the copper etch step, showed very smooth topography. However, in the standard process where capping is done after seed layer removal, the plated copper surfaces look rough and this topography is replicated in the capping layer.

This invention has the added advantage of being able to use electrolytic capping processes. This removes the prior art restriction of using only electroless plating. By going to an electrolytic process one has chosen a more environmentally friendly concept to use versus the electroless capping process.

Furthermore, this is a much simpler method because the plating of the capping layer follows the copper plating. And, if resist reflow were needed, this could be achieved after the bake step.

An alternative way to create a gap 18, between the photoresist and the sidewalls of the copper features is to etch the photoresist at a slow rate and to stop after removing about 2 microns of the photoresist. This etching solution can be the standard developer previously used to define the features over the seed layer surface 19. It is preferred that the developer is heated, for example to about 40° C. for a total etch time of about 3 to about 5 minutes. The developer used was manufactured by Shipley, Marlborough, Mass., USA. This technique improves the logistics considerably since the heated developer tool can easily be integrated into the plating tool.

Similarly, in the case of plated copper lines, based on feature dimension and the nature of subsequent processing, it would not be necessary to reflow resist to ensure sidewall capping, making the process extremely attractive in terms of reliability, logistics and costs, since the plating operations are essentially completed in one sector before the part is moved out to the resist strip sector.

EXAMPLE

The following example is intended to further illustrate the invention and is not intended to limit the scope of the invention in any manner.

EXAMPLE 1

On a standard multi-layered ceramic substrate 10, the copper lines 18, were capped prior to the stripping process.

The structure had a first seed layer of chromium 12. The second seed layer of copper 14, was then deposited on top of the first seed layer of chromium 12. The copper interconnect 18, itself had a thickness of about 50,000 angstroms. The resist chosen was manufactured by Shipley, Marlborough, Mass., USA, and it was baked after the copper plating at a temperature of about 105° C. For this resist material the baking time was about 30 minutes. After the baking a gap of about 15,000 angstroms appeared. A capping layer of nickel 23, having a thickness of about 2,000 angstroms, was then formed over the copper lines 18, and the resist 26, was removed as discussed earlier.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A capped electrical interconnect structure comprising a substrate, having at least one first seed layer, at least one second seed layer over said at least one first seed layer, a copper material on a portion of said at least one second seed layer and at least one capping material which completely envelopes said copper material, wherein a peripheral edge portion of said at least one capping material makes direct electrical contact with a portion of the upper surface of said at least one second seed layer and wherein the side walls of said at least one first seed layer and said at least one second seed layer do not have any capping material, and, wherein the total thickness of said at least one first seed layer and said at least one second seed layer is at least about 0.05 micron, and wherein material for said at least one first seed layer is different than material for said at least one second seed layer, and wherein at least a portion of said substrate is selected from a group consisting of ceramic substrate or glass ceramic substrate.

2. A capped electrical interconnect structure comprising a substrate, having at least one first seed layer, at least one second seed layer over said at least one first seed layer, a copper material on a portion of said at least one second seed layer and at least one capping material which completely envelopes said copper material, wherein a peripheral edge portion of said at least one capping material makes direct electrical contact with a portion of the upper surface of said at least one second seed layer and wherein the side walls of said at least one first seed layer and said at least one second seed layer do not have any capping material, and, wherein the thickness of said copper material is between about 0.5 micron and about 100.0 microns, and wherein at least a portion of said substrate is selected from a group consisting of ceramic substrate or glass ceramic substrate.

3. A capped electrical interconnect structure comprising a substrate, having at least one first seed layer, at least one second seed layer over said at least one first seed layer, a copper material on a portion of said at least one second seed layer and at least one capping material which completely envelopes said copper material, wherein a peripheral edge portion of said at least one capping material makes direct electrical contact with a portion of the upper surface of said at least one second seed layer and wherein the side walls of said at least one first seed layer and said at least one second seed layer do not have any capping material, and, wherein the thickness of said capping layer is between about 0.005 micron and about 10.000 microns, and wherein at least a portion of said substrate is selected from a group consisting of ceramic substrate or glass ceramic substrate.

4. A capped electrical interconnect structure comprising a substrate, having at least one first seed layer, at least one second seed layer over said at least one first seed layer, a copper material on a portion of said at least one second seed layer and at least one capping material which completely envelopes said copper material, wherein a peripheral edge portion of said at least one capping material makes direct electrical contact with a portion of the upper surface of said at least one second seed layer and wherein the side walls of said at least one first seed layer and said at least one second seed layer do not have any capping material, and, wherein the total thickness of said at least one first seed layer and said at least one second seed layer is at least about 0.05 micron, and wherein material for said at least one first seed layer is different than material for said at least one second seed layer, and wherein material for said at least one first seed layer is selected from a group consisting of chromium, titanium, titanium-tungsten or alloys thereof.

5. A capped electrical interconnect structure comprising a substrate, having at least one first seed layer, at least one second seed layer over said at least one first seed layer, a copper material on a portion of said at least one second seed layer and at least one capping material which completely envelopes said copper material, wherein a peripheral edge portion of said at least one capping material makes direct electrical contact with a portion of the upper surface of said at least one second seed layer and wherein the side walls of said at least one first seed layer and said at least one second seed layer do not have any capping material, and, wherein the total thickness of said at least one first seed layer and said at least one second seed layer is at least about 0.05 micron, and wherein material for said at least one first seed layer is different than material for said at least one second seed layer, and wherein material for said at least one second seed layer is selected from a group consisting of aluminum, copper or alloys thereof.

* * * * *